United States Patent
Boussadia

(10) Patent No.: US 11,067,621 B2
(45) Date of Patent: Jul. 20, 2021

(54) APPARATUS FOR BURNING IN ELECTRONIC COMPONENTS

(71) Applicant: 3D PLUS, Buc (FR)

(72) Inventor: Mohamed Boussadia, Trappes (FR)

(73) Assignee: 3D PLUS, Buc (FR)

( * ) Notice: Subject to any disclaimer, the term of this patent is extended or adjusted under 35 U.S.C. 154(b) by 0 days.

(21) Appl. No.: 16/455,595

(22) Filed: Jun. 27, 2019

(65) Prior Publication Data
US 2020/0003826 A1    Jan. 2, 2020

(30) Foreign Application Priority Data
Jun. 29, 2018    (FR) ........................................ 1855957

(51) Int. Cl.
| | | |
|---|---|---|
| G01R 31/28 | (2006.01) | |
| G05B 1/00 | (2006.01) | |
| G01R 1/00 | (2006.01) | |
| G11C 5/00 | (2006.01) | |

(52) U.S. Cl.
CPC ..... *G01R 31/2817* (2013.01); *G01R 31/2808* (2013.01)

(58) Field of Classification Search
CPC ........ G05B 1/00; G05B 2219/00; G01R 1/00; G11C 5/00; G11C 2207/00
See application file for complete search history.

(56) References Cited

U.S. PATENT DOCUMENTS

| | | | |
|---|---|---|---|
| 2006/0071678 A1* | 4/2006 | Norris | G01R 31/2868 324/750.05 |
| 2007/0269911 A1 | 11/2007 | Co et al. | |
| 2008/0143379 A1* | 6/2008 | Norman | H01L 23/5382 326/39 |
| 2014/0253157 A1* | 9/2014 | Dean | G01R 1/44 324/750.09 |
| 2015/0028908 A1* | 1/2015 | Kushnick | G11C 29/56012 324/750.05 |
| 2016/0109509 A1* | 4/2016 | Appello | G01R 31/2889 324/750.05 |
| 2016/0139198 A1 | 5/2016 | Park et al. | |
| 2016/0334462 A1 | 11/2016 | Jung et al. | |
| 2018/0059174 A1 | 3/2018 | Mardi | |

FOREIGN PATENT DOCUMENTS

CN    101 859 718 B    10/2010

\* cited by examiner

*Primary Examiner* — Jermele M Hollington
*Assistant Examiner* — Temilade S Rhodes-Vivour
(74) *Attorney, Agent, or Firm* — BakerHostetler

(57) ABSTRACT

An apparatus for burning in electronic components, which includes a plurality of assemblies placed in a holder, each assembly comprising a printed circuit board on which are placed sockets intended to receive electronic components and a burn-in driver. The holder is at room temperature, and each assembly comprises a single chamber that is regulated to a temperature T°>80° C., in which chamber at least four sockets are placed. The printed circuit board forming one wall of the chamber, the burn-in driver is soldered directly to the printed circuit board on the side exterior to the chamber, with a single burn-in driver per chamber, and the assembly furthermore comprises means for dissipating only the thermal energy of operation of the burn-in driver.

3 Claims, 1 Drawing Sheet

APPARATUS FOR BURNING IN ELECTRONIC COMPONENTS

CROSS-REFERENCE TO RELATED APPLICATIONS

This application claims priority to foreign French patent application No. FR 1855957, filed on Jun. 29, 2018, the disclosure of which is incorporated by reference in its entirety.

FIELD OF THE INVENTION

The field of the invention is that of the burn-in of electronic components, especially those operating at high frequencies. By burn-in what is more particularly meant is a sequence of thermal and electrical stresses the aim of which is to accelerate the ageing of these electronic components in order to eliminate infant-mortality defects during the production thereof.

BACKGROUND

Certain new electronic components that have recently appeared on the market have as operational constraint the need for a guaranteed minimum operating frequency, which was not required of old components. This minimum operating frequency is typically about 300 MHz. Among these new components, mention may be made of DDR3 SDRAM random-access memories (DDR3 SDRAM being the acronym of Double Data Rate 3rd generation Synchronous Dynamic Random Access Memory), DDR4 SDRAM random-access memories, or random-access memories of later generations.

On the market, two different approaches are currently employed to age electronic components:
- an approach allowing burn-in at low frequencies (<20 MHz) by manufacturers (foundries);
- use of burn-in testbeds developed by the company BiBench, one example of which is shown in FIG. 1. The burn-in procedure is driven by an electronic burn-in driver 10 that is connected by a connector 11 to the component 20 to be burnt-in. The job of this circuit is to drive a sequence of electrical stresses in an environment that is thermally stressed (via the use of an oven 100). More precisely, the component 20 is placed in a socket 15 mounted on a PCB 30 (acronym of printed circuit board), and is connected to the connector 11 via this PCB. It will be recalled that in order to achieve the minimum required operating frequency (300 MHz), the driver-component distance must be small (typically smaller than 8 cm). A plurality of driver-connector-PCB-socket assemblies 60 are placed in an oven at 125° C., this oven 100 playing the dual role of holder of these assemblies and of hot chamber. However, although it is necessary for the component to be subjected to this temperature, it is in contrast indispensable to protect the driver from this temperature. Hence, the driver 10 (and its connector 20) is itself placed in a cooled casing that has two purposes: to insulate it from the ambient temperature of the oven (125° C.) and to evacuate the thermal energy of operation of the driver. The internal temperature of the cooled casing is regulated via a cooling system. This solution is technically very advantageous but possesses two main limitations: it does not address the issues encountered in an industrial production environment (high number of components) because it is too laboratory oriented (one or two components per driver), and it therefore has too great a recurring expense.

Currently, all the burn-in solutions available on the market are therefore limited in terms of operating frequency (<125 MHz) or, with respect to those that meet the minimum frequency constraint (300 MHz), the design thereof does not meet the conditions of industrialization.

SUMMARY OF THE INVENTION

The aim of the invention is to mitigate these drawbacks. Therefore, there remains to this day a need for an apparatus that satisfactorily meets all the aforementioned requirements, in terms of number of electronic components to be burnt-in, and in terms of the cost of their burn-in.

More precisely, the subject of the invention is a burn-in apparatus for burning in electronic components, which comprises a plurality of assemblies placed in a holder, each assembly comprising a printed circuit board on which are placed sockets intended to receive electronic components and a burn-in driver. It is mainly characterized in that the holder is at room temperature, in that each assembly comprises a single chamber that is regulated to a temperature T°>80° C., in which chamber at least four sockets are placed, the printed circuit board forming one wall of the chamber, in that the burn-in driver is soldered directly to the printed circuit board on the side exterior to the chamber, with a single burn-in driver per chamber, and in that the assembly furthermore comprises means for dissipating only the thermal energy of operation of the burn-in driver.

Advantageously, the regulation temperature T° of a chamber varies from one chamber to the next.

Each chamber typically comprises 4 to 20 sockets.

The distance on the printed circuit board, between the burn-in driver and the electronic components closest to the burn-in driver, is preferably smaller than 8 cm.

BRIEF DESCRIPTION OF THE DRAWINGS

Other features and advantages of the invention will become apparent on reading the following detailed description, which is given by way of nonlimiting example and with reference to the appended drawings, in which.

DETAILED DESCRIPTION

Figure 1:
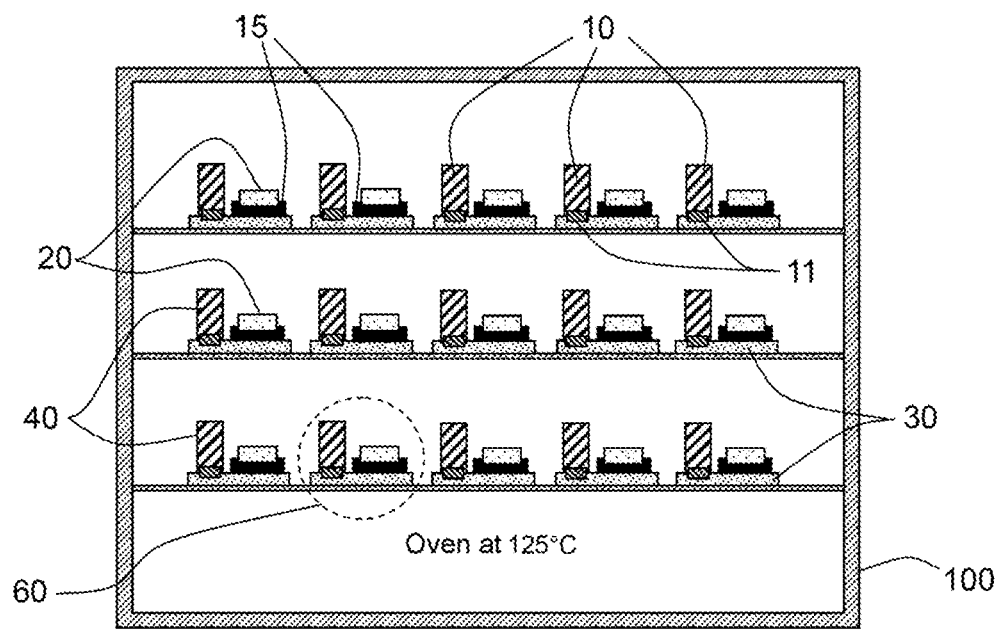
FIG. 1, which has already been described, schematically shows an example of a burn-in apparatus according to the prior art, FIG. 2 schematically shows an example of a burn-in apparatus according to the invention, In both the figures, the same elements have been referenced with the same references.
Figure 2:
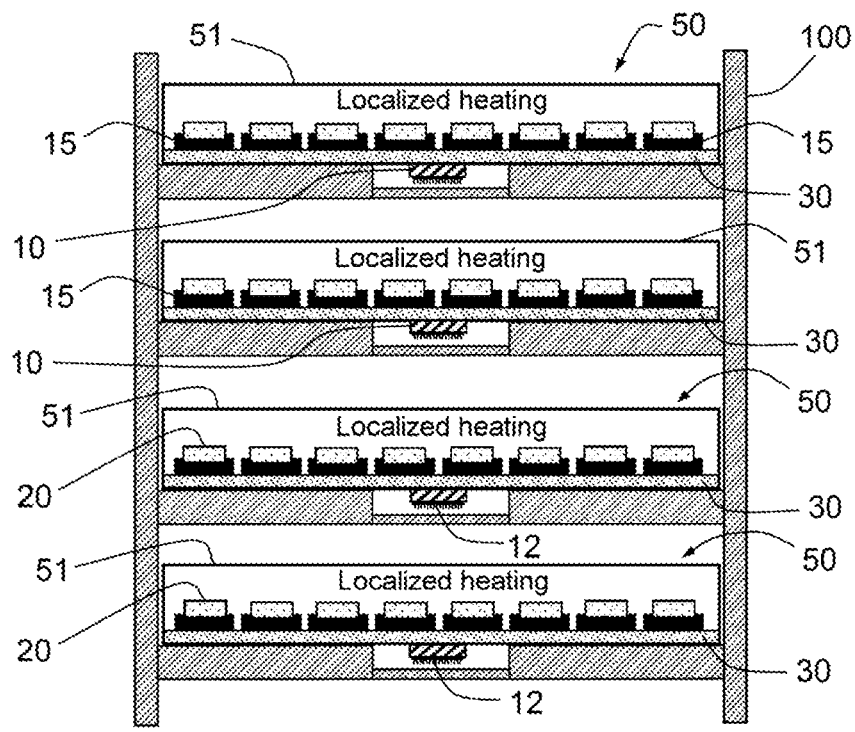

An example of a burn-in apparatus according to the invention will now be described with reference to FIG. 2. This apparatus comprises a holder 100 to which are fastened a plurality of burn-in assemblies. This open or closed holder is at room temperature. Each assembly 50 comprises:
- a single chamber 51 that is regulated to a temperature T°>80° C.;
- an optionally multilayer printed circuit board 30 or PCB forming one wall of the chamber 51; on the chamber-side face of the PCB are placed sockets 15 that are intended to receive the electronic components 20 to be burnt-in, with one socket per component;

a burn-in driver 10, with a single burn-in driver per chamber; the circuit is soldered directly to the PCB 30 on the side exterior to the chamber, i.e. without using any connector, connectors generally having a limited number of input-outputs with respect to the number of input-outputs of the electronic components. Specifically, a 66 input-output connector will for example not allow the driver to scan all the 72 input-outputs of a DDR3 memory. In contrast, by connecting the driver directly to a multilayer PCB, it is easily possible to provide, in the PCB, as many tracks (460 for example) as required to connect each input-output of the component 20 to the burn-in driver 10. This burn-in driver 10, which is located on the exterior of the hot chamber, is therefore at room temperature. It is located on the PCB so that the distance between the circuit 10 and the electronic components 20 closest the circuit is smaller than 8 cm, in order to achieve or exceed the required operating frequency of 300 MHz; and means 12 for dissipating only the thermal energy of operation of the burn-in driver 10. Specifically, since the latter is no longer located in an oven at 125° C., but is at room temperature, it is no longer necessary to use dual-purpose cooling means such as described with reference to FIG. 1; an energy saving results. These means, which merely have the conventional function of dissipating the thermal energy generated by the burn-in driver during its operation, are conventional means.

As may be seen in the figure, a plurality of assemblies 50 are installed in the holder 100. The temperature regulation may vary from one chamber to the next: a chamber 51 housing certain components 20 may for example be regulated to a first temperature, 80° C. for example, another chamber 51, housing other components 20, being regulated to another temperature, 125° C. for example. Furthermore, the temperature of each chamber 51 is very uniform; a maximum difference of 1° C. is obtained between the various components housed in a chamber, whereas, in a conventional oven, at best a difference of 4° C. is obtained between the components, depending on whether they are installed at the bottom or at the edge of the oven. The electronic components of a chamber are identical, but the electronic components placed in one chamber may be different from those of another chamber; various electronic components may advantageously be burnt-in at the same time in the same holder. It is for example possible to burn-in DDR3 memories in a first assembly by regulating the chamber to 125° C., DDR4 memories in a second assembly by also regulating the chamber to 125° C., processors in a third assembly by regulating the chamber to 100° C., etc. A holder typically comprises between 2 and 200 assemblies, or even more.

This apparatus is economical to operate in so far as it is only the volume of the chambers that is temperature regulated and not the entire volume of an oven.

The invention claimed is:

1. A burn-in apparatus for burning in electronic components, which comprises a plurality of assemblies placed in a holder, each assembly comprising a printed circuit board on which are placed sockets intended to receive electronic components comprising at least one DDR3 SDRAM memory or more, and a burn-in driver, the holder being at room temperature, each assembly comprising a single chamber that is regulated to a temperature T°>80° C., in which chamber at least four sockets are placed, the printed circuit board forming one wall of the chamber, the sockets being directly placed on the printed circuit board on the side interior to the chamber, the burn-in driver being soldered directly to the printed circuit board on the side exterior to the chamber, with a single burn-in driver per chamber, and the assembly furthermore comprising means for dissipating only the thermal energy of operation of the burn-in driver, wherein the distance on the printed circuit board between the burn-in driver and the sockets closest to the burn-in driver is smaller than 8 cm.

2. The burn-in apparatus according to claim 1, wherein the regulation temperature T° of a chamber varies from one chamber to the next.

3. The burn-in apparatus according to claim 1, wherein each chamber comprises 4 to 20 sockets.

* * * * *